(12) United States Patent
Zhao et al.

(10) Patent No.: US 6,321,449 B2
(45) Date of Patent: *Nov. 27, 2001

(54) METHOD OF FORMING HOLLOW CHANNELS WITHIN A COMPONENT

(75) Inventors: Ji-Cheng Zhao; Melvin Robert Jackson, both of Niskayuna; Paul Leonard Dupree, Scotia, all of NY (US); James Ross Dobbs, Tallahassee, FL (US)

(73) Assignee: General Electric Company, Schenectady, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/190,066

(22) Filed: Nov. 12, 1998

(51) Int. Cl.$^7$ .................................................. B21D 53/00
(52) U.S. Cl. ....................................... 29/890.01; 29/890.02
(58) Field of Search ............................... 29/890.01, 424, 29/890.02, 423, 527.4; 164/518, 519; 60/260, 267, 271

(56) References Cited

U.S. PATENT DOCUMENTS

| | | | |
|---|---|---|---|
| 3,595,025 | * 7/1971 | Stockel et al. | 29/890.01 |
| 4,582,678 | * 4/1986 | Niino et al. | 29/890.01 |
| 4,584,171 | * 4/1986 | Niino et al. | 29/890.01 |
| 4,956,037 | 9/1990 | Vivaldi . | |
| 5,075,966 | * 12/1991 | Mantkowski | 29/890.01 |
| 5,249,357 | 10/1993 | Holmes et al. . | |
| 5,626,462 | 5/1997 | Jackson et al. . | |
| 5,640,767 | 6/1997 | Jackson et al. . | |
| 5,820,337 | 10/1998 | Jackson et al. . | |

* cited by examiner

*Primary Examiner*—I. Cuda Rosenbaum
(74) *Attorney, Agent, or Firm*—Paul J. DiConza; Donald S. Ingraham

(57) ABSTRACT

A method of forming an internal channel within an article, such as a cooling channel in an air-cooled blade, vane, shroud, combustor or duct of a gas turbine engine. The method generally entails forming a substrate to have a groove recessed in its surface. A sacrificial material is then deposited in the groove to form a filler that can be preferentially removed from the groove. A permanent layer is then deposited on the surface of the substrate and over the filler, after which the filler is removed from the groove to yield the desired channel in the substrate beneath the permanent layer.

19 Claims, 1 Drawing Sheet

METHOD OF FORMING HOLLOW CHANNELS WITHIN A COMPONENT

The present invention relates to methods of forming internal channels in components. More particularly, this invention is directed to materials and methods for forming a cooling channel beneath the surface of an air-cooled component, such as a blade, vane, shroud, combustor or duct of a gas turbine engine.

BACKGROUND OF THE INVENTION

Higher operating temperatures for gas turbine engines are continuously sought in order to increase their efficiency. However, as operating temperatures increase, the high temperature durability of the components of the engine must correspondingly increase. Significant advances in high temperature capabilities have been achieved through formulation of iron, nickel and cobalt-based superalloys, though components formed from such alloys often cannot withstand long service exposures if located in certain sections of a gas turbine engine, such as the turbine, combustor or augmentor.

A common solution is to provide internal cooling of turbine, combustor and augmentor components, at times in combination with a thermal barrier coating. Airfoils of gas turbine engine blades and vanes often require a complex cooling scheme in which cooling air flows through cooling channels within the airfoil and is then discharged through carefully configured cooling holes at the airfoil surface. Convection cooling occurs within the airfoil from heat transfer to the cooling air as it flows through the cooling channels. In addition, fine internal orifices can be provided to direct cooling air flow directly against inner surfaces of the airfoil to achieve what is referred to as impingement cooling, while film cooling is often accomplished at the airfoil surface by configuring the cooling holes to discharge the cooling air flow across the airfoil surface so that the surface is protected from direct contact with the surrounding hot gases within the engine.

In the past, cooling channels have typically been integrally formed with the airfoil casting using relatively complicated cores and casting techniques. More recently, U.S. Pat. Nos. 5,626,462 and 5,640,767, both to Jackson et al. and commonly assigned with the present invention, teach a method of forming a double-walled airfoil by depositing an airfoil skin over a separately-formed inner support wall (e.g., a spar) having surface grooves filled with a sacrificial material. After the airfoil skin is formed, preferably by deposition methods such as plasma spraying and electron-beam physical vapor deposition (EBPVD), the sacrificial material is removed to yield a double-walled airfoil with cooling channels that circulate cooling air against the interior surface of the airfoil skin.

In Jackson et al., the sacrificial material is a braze alloy deposited in excess amounts in a spar groove, with the excess being removed by machining or another suitable technique so that the surface of the braze alloy is flush with the surrounding surface of the spar. The sacrificial material is then removed after deposition of the airfoil skin by melting/extraction, chemical etching, pyrolysis or another suitable method. Though braze alloys have been successful in the process disclosed by Jackson et al., efforts have continued to develop other materials that better meet the requirements described previously. Notably, sacrificial materials proposed for other applications have been tried without success. For example, a combination of $K_2SO_4$ and $Na_2AlO_3$ was experimented with as a sacrificial backfill material, but found to be corrosive and severely attacked a spar formed of Rene N5, a General Electric nickel-based superalloy having a nominal composition, in weight percent, of Ni-7.5Co-7.0Cr-6.5Ta-6.2Al-5.0W-3.0Re-1.5Mo-0.15Hf-0.05C-0.004B-0.01Y. Other known sacrificial materials, including those disclosed in U.S. Pat. No. 4,956,037 to Vivaldi and U.S. Pat. No. 5,249,357 to Holmes et al., are unable to withstand high-temperature deposition processes such as EBPVD.

In view of the above, it would be desirable if improved sacrificial materials and processes were available that could ensure that all of the aforementioned requirements of the sacrificial material were adequately met to produce an air-cooled component with a deposited skin that is substantially free of surface defects.

BRIEF SUMMARY OF THE INVENTION

According to the present invention, there are provided sacrificial materials and methods for forming an internal channel in an article, and particularly a cooling channel in an air-cooled component, such as a blade, vane, shroud, combustor or duct of a gas turbine engine. Each of the methods generally entails forming a substrate to have a groove recessed in its surface. The sacrificial material is deposited and consolidated in the groove so that the groove is completely filled. A permanent layer is then deposited on the surface of the substrate and over the sacrificial material in the groove, after which the sacrificial material is removed from the groove to form a channel in the substrate beneath the permanent layer.

Four embodiments of this invention are disclosed, each of which generally entails the use of different candidates for the sacrificial material. The preferred process for depositing the permanent layer on the spar and sacrificial material is electron beam physical vapor deposition (EBPVD). In a first embodiment of the invention, the sacrificial material is either NaCl, $KBO_2$, $NiCl_2$, $MgSO_4$, $NiF_2$, $NaAlO_2$, or mixtures of $NaAlO_2$ and $NaAlSiO_4$, and is deposited in the form of a paste. In a second embodiment, the sacrificial material is formulated to enable depositing and consolidating the material in the groove at low temperatures (i.e., cold pressing), preferably less than 200° C. Suitable sacrificial materials for this process are KBr, NaCl, $NiBr_2$, BN, and mixtures of talc ($Mg_6[Si_8O_{20}](OH)_4$) and pyrophyllite ($Al_4[Si_8O_{20}](OH)_4$). In a third embodiment, the sacrificial material is deposited and then sintered in the groove at an elevated temperature (i.e., hot pressing). Sacrificial materials suitable for this process are $MgF_2$, $NiF_2$, and mixtures of talc and pyrophyllite. Finally, the fourth embodiment of this invention employs as the sacrificial material $MoO_3$ or another material capable of being sublimed above a certain temperature. This method entails depositing a relatively compliant layer over the sacrificial material, heating the sacrificial material to remove the sacrificial material by sublimation, and then depositing a second, less compliant layer on the first layer to produce a multilayer skin on the substrate.

In accordance with the above, the present invention identifies certain compositions suitable for use as sacrificial materials when appropriately processed by one of the four above-noted methods. The sacrificial materials of this invention and their associated process requirements address the aforementioned requirements for the sacrificial material, particularly with respect to exhibiting adequate adhesion to the spar and minimal shrinkage prior to and during the deposition step. As a result, the disclosed materials and processes are able to produce air-cooled components with deposited skins that are substantially free of surface defects.

Other objects and advantages of this invention will be better appreciated from the following detailed description.

DETAILED DESCRIPTION OF THE INVENTION

Figure 1:
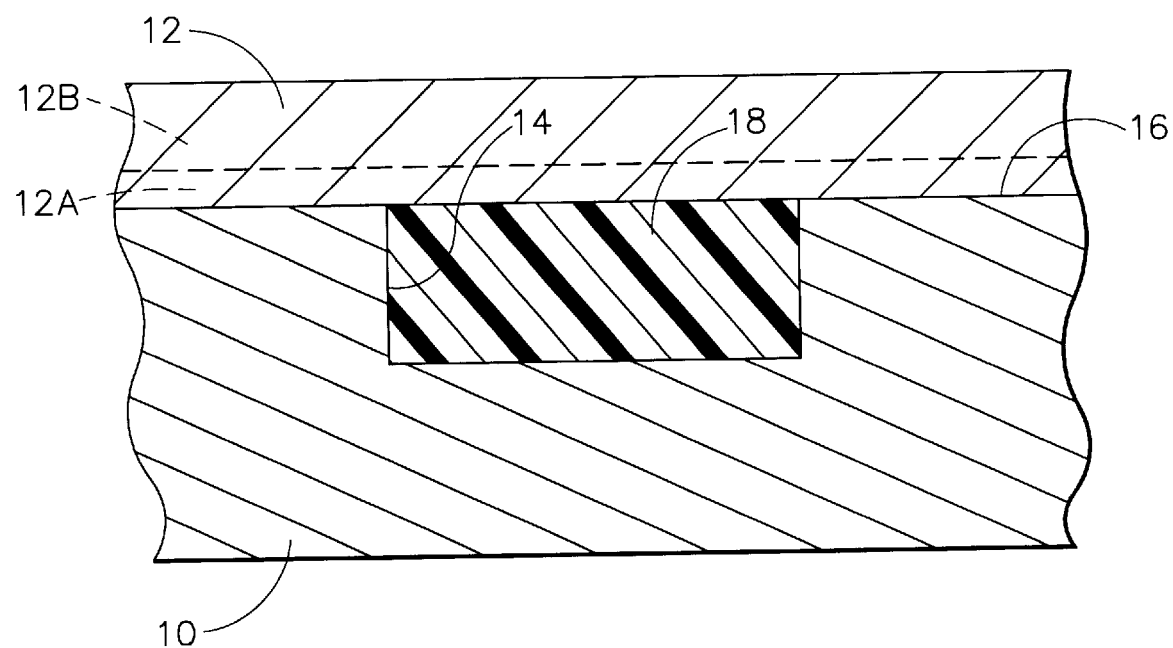
FIG. 1 shows a processing stage when forming a cooling channel below the skin of a double-walled airfoil in accordance with the present invention.

The present invention is generally applicable to any component in which an internal channel is desired. The advantages of this invention are particularly applicable to gas turbine engine components that employ internal cooling to maintain their service temperatures at an acceptable level. Notable examples of such components include shrouds, combustors, ducts and airfoils of high and low pressure turbine vanes and blades.

The invention is generally an improvement of the method disclosed in U.S. Pat. Nos. 5,626,462 and 5,640,767, both to Jackson et al., which are incorporated herein by reference. Referring to FIG. 1, four embodiments of the invention will be described in terms of a component, such as a turbine vane or blade airfoil, having a double-walled construction formed by the deposition of an airfoil skin 12 over a substrate 10, such as a cast spar, having a groove 14 formed in its outer surface 16. The groove 14 will typically have a rectilinear cross-section and extend in the longitudinal direction of the airfoil, though it is foreseeable that the groove 14 could have any configuration suitable for a particular component. In each embodiment, a sacrificial material is deposited and, if necessary, consolidated in the groove 14 to form a sacrificial filler 18 that completely fills the groove 14. The permanent skin 12 is then deposited on the surface 16 of the substrate 10 and over the sacrificial filler 18 in the groove 14, after which the filler 18 is removed from the groove 14 to form a hollow cooling channel in the substrate 10 beneath the skin 12.

In each embodiment, certain compositions have been shown to be able to form suitable sacrificial fillers 18 when appropriately processed by one of four processes. Particularly, these compositions form fillers 18 that exhibit: (a) compositional compatibility with nickel-base superalloys at temperatures required to deposit the airfoil skin 12, e.g., at least 700° C. and preferably at least 1200° C. for EBPVD; (b) compositional stability at skin deposition temperatures; (c) ease of removal after skin deposition; (d) adhesion to a nickel-based substrate 10 at low and high temperatures prior to and during skin deposition, respectively; (e) minimal densification shrinkage relative to a nickel-based substrate 10 as the filler 18 is heated during skin deposition; (f) a comparable coefficient of thermal expansion (CTE) to nickel-based superalloys; (g) ease of cleaning from the substrate 10 prior to skin deposition so that the skin 12 is deposited and bonded directly to the substrate 10; and (h) formable to completely fill the groove 14 and achieve a smooth, reasonably dense fill surface on which the skin 12 is deposited. If any of items (d) through (h) are not met, a gap may be present within the groove during skin deposition, which, if sufficiently large, will lead to an unacceptable surface defect in the airfoil skin. Airfoil skins deposited by EBPVD are particularly sensitive to surface discontinuities due to the atom-by-atom manner in which the coating is built up. Shrinkage and adhesion of the sacrificial material to the spar have been identified as particularly key issues to the reliable production of airfoils using the technique taught by Jackson et al. When appropriately processed, each of the sacrificial materials addresses the aforementioned requirements, particularly with respect to exhibiting adequate adhesion to the nickel-based superalloys and minimal shrinkage prior to and during skin deposition.

In the first embodiment of the invention, the sacrificial filler 18 is formed by depositing in the groove 14 a paste that contains a solvent or binder and a sacrificial material of either NaCl (sodium chloride), $KBO_2$ (potassium borate), $NiCl_2$ (nickel chloride), $MgSO_4$ (magnesium sulfate), $NiF_2$ (nickel fluoride), $NaAlO_2$ (sodium aluminate), or mixtures of $NaAlO_2$ and $NaAlSiO_4$ (sodium aluminosilicate). Suitable binders include a water-based composition known as Vitta Gel and commercially available from Vitta Corporation. Suitable solvents will depend on the specific sacrificial material used, and include water, alcohols, acetone, sodium hydroxide (NaOH) and potassium hydroxide (KOH). The paste is deposited to completely fill the groove 14, and then ground and polished after curing (drying) to yield a smooth surface that is substantially coplanar with the surface 16 of the substrate 10, such that the skin 12 will not develop a depression over the groove 14. The skin 12 is then preferably deposited by EBPVD to cover the substrate 10 and the sacrificial filler 18, after which the filler 18 is completely removed by etching or dissolution to yield a cooling channel. A preferred EBPVD technique for depositing the skin 12 is disclosed in U.S. Pat. No. 5,474,809, incorporated herein by reference.

The sacrificial materials indicated above for the filler 18 are each compatible with substrates 10 formed of nickel-based superalloys in terms of CTE, adhesion and composition. Specifically, each of these sacrificial materials has a CTE sufficiently close to nickel-based superalloys to prevent the formation of an excessive gap from shrinkage during deposition of the skin 12. These materials have also been shown to adhere well to nickel-base superalloys, and to be compatible with nickel-based superalloys to the sense that minimal interdiffusion occurs during the consolidation and deposition steps. Finally, fillers 18 formed of these sacrificial materials can be preferentially etched from nickel-based substrates 10. Preferred etchants or solvents for this purpose include water, alcohols, acetone, sodium hydroxide and potassium hydroxide.

In a second embodiment of this invention, the sacrificial material is formulated to enable filling the groove 14 by a cold pressing operation, i.e., depositing and consolidating the material in the groove 14 at a low temperature, preferably less than 200° C. Consolidation of the sacrificial material within the groove 14 can be achieved using various techniques known in the art, such as cold pressing with a die. Suitable sacrificial materials for cold pressing must have very low hardness, e.g., less than about 4 on the Moh scale of hardness, so that they can be pressed at ambient or low temperatures to yield a filler 18 whose surface is roughly coplanar with the surface 16 of the substrate 10. Preferred sacrificial materials having this characteristic are KBr (potassium bromide), NaCl, $NiBr_2$ (nickel bromide), BN (boron nitride), and mixtures of talc and pyrophyllite. Fillers 18 formed of these sacrificial materials can be removed from nickel-based substrates 10 using water, alcohols or acetone. For example, BN filler can be removed with, sodium hydroxide and potassium hydroxide.

In the third embodiment, the sacrificial material is formulated to fill the groove 14 by hot pressing, i.e., deposited and then sintered in the groove 14 at an elevated temperature to form the filler 18, in accordance with hot pressing techniques known in the art. Thermal expansion matching, compatibility with nickel-based superalloys, and high melting points are of most concern for sacrificial materials used in the hot pressing process. According to this invention, materials that address these considerations are $MgF_2$ (magnesium fluoride), $NiF_2$, and mixtures of talc and pyrophyllite. Sintering temperatures for these materials are generally less than 1000° C., allowing their use with nickel-based superalloys. Fillers 18 formed of these sacrificial materials can be preferentially removed from nickel-based substrates 10 using water, nitric acid ($HNO_3$), sodium hydroxide and potassium hydroxide.

Finally, in the fourth embodiment of this invention, the filler 18 is formed with a sacrificial material containing $MoO_3$ (molybdenum trioxide) or other substances capable of sublimation or of being sufficiently decomposed to release a portion of their volume as a gaseous phase at temperatures between about 500° C. and 1100° C. Any remaining portion of the filler 18 is then removed by dissolving in water, an alcohol, acetone or an acid. As with the previous sacrificial materials, the filler 18 is formed by depositing the sacrificial material in the groove 14 so that the surface of the filler 18 is substantially coplanar with the surrounding surface 16 of the substrate 10. A relatively compliant metallic layer 12A is then deposited by EBPVD on the sacrificial filler 18, after which the filler 18 is heated to above its sublimation temperature, which is about 800° C. for $MoO_3$. The remaining layer 12B of the skin 12 is then deposited on the first layer 12A. According to the invention, the first layer 12A is preferably formed to be more compliant that the second layer 12B in order to mitigate the effect of any filler shrinkage. For example, a compliant layer 12A of pure nickel may be deposited followed by the deposition of a less compliant layer 12B of a nickel-based superalloy. Where shrinkage is a problem with any embodiment of this invention, the skin 12 may be deposited as multiple discreet permanent layers with at least the first being relatively more compliant, in accordance with this last embodiment of the invention.

While the invention has been described in terms of a preferred embodiment, it is apparent that other forms could be adopted by one skilled in the art. Therefore, the scope of the invention is to be limited only by the following claims.

What is claimed is:

1. A method of forming an internal channel in an article, the method comprising the steps of:
    forming a substrate having a surface and a groove recessed in the surface;
    depositing a paste in the groove so as to fill the groove, the paste comprising a sacrificial material in a binder, the sacrificial material being chosen from the group consisting of KBO2, NiCl2, MgSO4, NiF2, NaAlO2, and mixtures of NaAlO2 and NaAlSiO4;
    removing the binder so as to leave the sacrificial material in the groove, the sacrificial material defining a fill surface that is substantially coplanar with the surface of the substrate;
    depositing a permanent layer on the surface of the substrate and over the sacrificial material in the groove; and then
    removing the sacrificial material from the groove so as to form an internal channel in the substrate and beneath the permanent layer.

2. A method as recited in claim 1, wherein the permanent layer is deposited by electron beam physical vapor deposition.

3. A method as recited in claim 1, wherein the sacrificial material is removed by dissolving in water, an alcohol, acetone, sodium hydroxide or potassium hydroxide.

4. A method as recited in claim 1, wherein the article is a component of a gas turbine engine.

5. A method of forming an internal channel in an article, method comprising the steps of:
    forming a substrate having a surface and a groove recessed in the surface;
    consolidating a sacrificial material into the groove so as to fill the groove at a temperature of less than 200° C., the sacrificial material being chosen from the group consisting of KBr, NiBr2, BN, and mixtures of talc and pyrophyllite, the sacrificial material defining a fill surface that is substantially coplanar with the surface of the substrate;
    depositing a permanent layer on the surface of the substrate and over the sacrificial material in the groove; and then
    removing the sacrificial material from the groove so as to form an internal channel in the substrate and beneath the permanent layer.

6. A method as recited in claim 5, wherein the permanent layer is deposited by electron beam physical vapor deposition.

7. A method as recited in claim 5, wherein the sacrificial material is removed by dissolving in water, an alcohol, acetone, sodium hydroxide or potassium hydroxide.

8. A method as recited in claim 5, wherein the article is a component of a gas turbine engine.

9. A method of forming an internal channel in an article, the method comprising the steps of:
    forming a substrate having a surface and a groove recessed in the surface;
    depositing and sintering a sacrificial material in the groove so as to fill the groove, the sacrificial material being chosen from the group consisting of $MgF_2$, $NiF_2$, and mixtures of talc and pyrophyllite, the sacrificial material defining a fill surface that is substantially coplanar with the surface of the substrate;
    depositing a permanent layer on the surface of the substrate and over the sacrificial material in the groove; and then
    removing the sacrificial material from the groove so as to form an internal channel in the substrate and beneath the permanent layer.

10. A method as recited in claim 9, wherein the permanent layer is deposited by electron beam physical vapor deposition.

11. A method as recited in claim 9, wherein the sacrificial material is removed by dissolving in water or nitric acid.

12. A method as recited in claim 9, wherein the article is a component of a gas turbine engine.

13. A method of forming an internal channel in an article, the method comprising the steps of:
    forming a substrate having a surface and a groove recessed in the surface;
    depositing a sacrificial material in the groove so as to fill the groove, the sacrificial material being chosen from the group consisting of $MoO_3$ and substances with sublimation temperatures between about 500° C. and 1100° C., the sacrificial material defining a fill surface that is substantially coplanar with the surface of the substrate;
    depositing a first permanent layer on the surface of the substrate and over the sacrificial material in the groove;

heating the sacrificial material to remove the sacrificial material from the groove by sublimation so as to form an internal channel in the substrate and beneath the first permanent layer; and then.

depositing a second permanent layer on the first permanent layer, the first permanent layer being more compliant than the second permanent layer.

14. A method as recited in claim 13, wherein the first and second permanent layers are deposited by electron beam physical vapor deposition.

15. A method as recited in claim 13, wherein only a portion of the sacrificial material decomposes by sublimation during the heating step, with a remaining portion of the sacrificial material being removed by dissolving in water, an alcohol, acetone or an acid.

16. A method as recited in claim 13, wherein the article is a component of a gas turbine engine.

17. A method of forming an internal channel in an article, the method comprising the steps of:

forming a substrate having a surface and a groove recessed in the surface;

depositing a paste in the groove so as to fill the groove, the paste comprising a sacrificial material in a binder, the sacrificial material being chosen from the group consisting of NaCl, $KBO_2$, $NiCl_2$, $MgSO_4$, $NiF_2$, $NaAlO_2$, and mixtures of $NaAlO_2$ and $NaAlSiO_4$;

removing the binder so as to leave the sacrificial material in the groove, the sacrificial material defining a fill surface that is substantially coplanar with the surface of the substrate;

depositing a permanent layer on the surface of the substrate and over the sacrificial material in the groove; and then removing the sacrificial material from the groove so as to form an internal channel in the substrate and beneath the permanent layer.

18. A method of forming an internal channel in a component of a turbine engine, comprising the steps of:

forming a substrate having a surface and a groove recessed in the surface;

depositing a paste in the groove so as to fill the groove, the paste comprising a sacrificial material in a binder, wherein the sacrificial material is compositionally stable at a temperature of at least about 1200° C.;

removing the binder so as to leave the sacrificial material in the groove, the sacrificial material defining a fill surface that is substantially coplanar with the surface of the substrate;

depositing a permanent layer on the surface of the substrate and over the sacrificial material in the groove, using electron-beam physical vapor deposition; and then removing the sacrificial material from the groove, so as to form an internal channel in the substrate and beneath the permanent layer.

19. The method of claim 18, wherein the sacrificial material is selected from the group consisting of $NaAlO_2$; mixtures of $NaAlO_2$ and $NaAlSiO_4$; BN, talc, pyrophyllite; and mixtures of talc and pyrophyllite.

* * * * *